MIS-FET PERMANENT REPAIR PHYSICAL DEVICE

Filed Dec. 31, 1968 2 Sheets-Sheet 1

United States Patent Office 3,539,880

Patented Nov. 10, 1970

3,539,880
MIS-FET PERMANENT REPAIR PHYSICAL DEVICE

Jon S. Squire, Linthicum Heights, and James R. Cricchi, Baltimore, Md., assignors to Westinghouse Electric Corporation, Pittsburgh, Pa., a corporation of Pennsylvania Filed Dec. 31, 1968, Ser. No. 788,199
Int. Cl. H01l *19/00*
U.S. Cl. 317—234 8 Claims

ABSTRACT OF THE DISCLOSURE

Two contact terminals of a component of an integrated circuit are insulated from each other by a layer of silicon oxide, or other insulator, of a predetermined thickness. As required, a low energy pulse is applied so that a sufficient field is produced in the insulator to break it down and form a permanent low resistance electrical path between the two electrical contacts. The permanent change from high to low resistance may be used for electrically disconnecting faulty semiconductor elements from a digital system as well as for electrically connecting elements into a digital system.

BACKGROUND OF THE INVENTION

Field of the invention

This invention relates to large scale integrated circuit digital systems, particularly the ability to replace faulty or defective elements to increase the reliability of the systems.

Description of the prior art

There is a continuing need for very reliable large scale integrated circuit digital systems. Using the most reliable components available provides a basis for reliable systems. Further improvement in reliability is obtainable through special circuits and additional devices.

Previously, electrically alterable permanent switches operated similar to fuses. These devices were typically short circuits until a large current was passed through the device. The current would have the effect of blowing the fuse and thereafter the devices were open circuits.

An object of this invention is to provide a semiconductor structure in an integrated circuit digital system which enables the semiconductor to be altered from an electrical open circuit to an electrical short circuit.

Another object is to provide a reliable, as well as an irreversible, means for electrically disconnecting faulty semiconductor elements from a digital system as well as for electrically connecting elements into a digital system.

Other objects of this invention will, in part, be obvious and will, in part, appear hereinafter.

SUMMARY OF THE INVENTION

In accordance with the teachings of this invention there is provided a semiconductor structure comprising at least a first and a second region of opposite type semiconductivity material forming a p-n junction between the regions terminating at a surface; a layer of electrically insulating material disposed on the structure and covering the termination of the junction; a first electrical contact disposed on the layer of electrically insulating material disposed on at least the second region; a second electrical contact disposed on, and affixed to, the second region; and means selectively to apply a pulse to the first contact of a magnitude sufficient to break down the insulating layer under the first electrical contact to make a permanent conductive electrical path through the second region between the first electrical contact and the second electrical contact.

DRAWINGS

In order to more fully understand the nature and objects of the invention, reference should be had to the following drawings in which.

DESCRIPTION OF THE INVENTION

Figure 1:
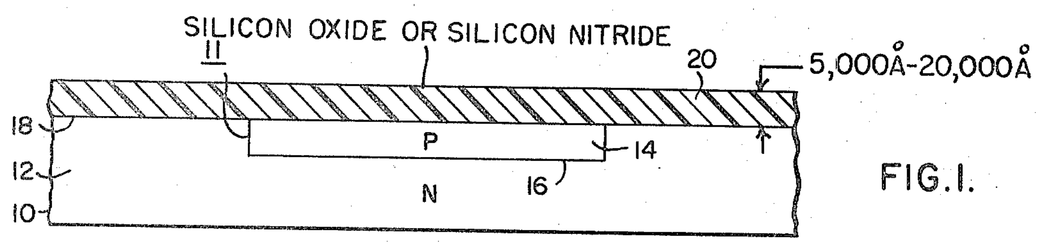
FIGS. 1 through 4 are elevation views in cross-section of a portion of a body of semiconductor material being processed in accordance with the teachings of this invention.

With reference to FIG. 1 there is shown a portion of a body of semiconductor material comprising an array 10 of semiconductor devices 11. The semiconductor devices 11 of the array 10 may be the same or different semiconductor devices and each may comprise two or more semiconductor regions, two of the regions being of opposite semiconductivity type and forming a p-n junction therebetween.

In order to more particularly describe the invention, and for no other purpose, the invention will be described in its relation to a two region semiconductor device 11 having a planar structure and comprising a portion of the array 10.

The portion of the array 10 shown in FIG. 1 comprises a first region 12 of first type semiconductivity, n-type in this example, a second region 14 of second type semiconductivity, p-type in this example, and a p-n junction 16 formed therebetween. The junction 16 terminates in the top surface 18 of the array 10. A layer 20 of an electrically insulating material is disposed on the surface 18, particularly on the terminations of the junction 16 and the immediately adjacent areas of both the region 12 and the region 14.

The material comprising the layer 20 may be any suitable electrically insulating material which can be broken down by utilization of a low energy pulse applied to an electrical contact disposed on the layer 20.

In this specification a low energy pulse is defined as a pulse of approximately 75 volts having a negligible current flow, the pulse duration being from 1 to 10 microseconds. Comparatively speaking the 75 volts is a high voltage when compared with the magnitude of the amperage reading for the current flow.

The layer 20 must be sufficiently broken down by the low energy pulse to permit a low resistance electrical path to be formed between the contact disposed on the layer 20 and the region of the array 10 desired to be connected. Since the electrical contacts and interconnections on the array 10 are usually ribbon like, it is necessary that the layer 20 also protect those portions of the array 10 which are not to be connected to the contact from accidental short circuiting. Therefore the layer 20 is shaped into at least two distinct portions each having desired thickness requirements. One portion must be thin enough to be capable of being broken down by the applied low energy pulse when required, yet it must be thick enough to resist accidental short circuiting when 6 to 10 volt electrical signals are applied to either electrical contact. The other portion of the layer 20 must be sufficiently thick enough to prevent accidental breaking down when the high voltage low energy pulse is applied.

Additionally, layer 20 is so designed so that only a low energy pulse, narrow in width, is necessary to achieve the breakdown of the reduced section or portion of the layer 20. The voltage of the pulse must be sufficiently high enough to break down the material of the reduced section. However, the pulse must be narrow enough to limit the field to only that reduced section or portion of the layer 20 which is to be broken down. If the applied energy pulse is too high, or if the pulse is too long then a complete destruction of the array 10 may result from metal of the contact diffusing into either the first region 12 or the second region 14 and then across the junction 16 or almost simultaneously diffusing into both regions 12 and 14 as well as across the junction 16.

Suitable materials for comprising the layer 20 are silicon oxide and silicon nitride. In order to more particularly describe the invention, and for no other purpose, the material comprising the regions 12 and 14 will be described as suitably doped silicon and the material comprising the layer 20 will be described as being silicon oxide.

The layer 20 of silicon oxide may be deposited on the surface 18 or the layer 20 may be thermally grown on the surface of the array 10 by oxidation of the array 10 in an atmosphere of oxygen containing water vapor. The layer 20 is from about 5,000 A. to 20,000 A. in thickness in order to protect the termination of the junction 16 in the surface 18.

Figure 2:
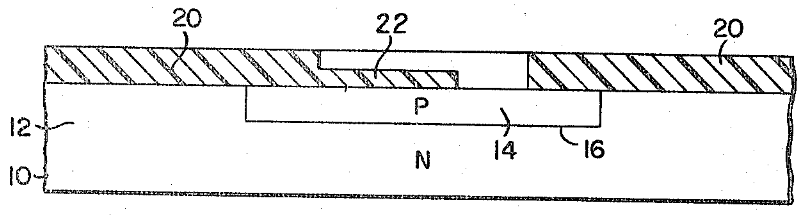

With reference to FIG. 2, a "window" is opened in the layer 20 of silicon oxide by a suitable process employing photolithographic techniques to achieve the proper mask design, followed by selective chemical etching with a suitable etchant such, for example, as hydrofluoric acid. Usually a two step process is required. The first processing reduces the layer 20 to a desired thickness. The second processing removes all of the silicon oxide layer 20 from above a preselected surface area of the region 14.

The processing produces a reduced section 22 of silicon oxide entirely disposed on the region 14. The section 22 is from about 200 A. to 1000 A. in thickness. A thickness of approximately 500 A. is preferred. With a preferred thickness of approximately 500 A., the low energy pulse need only have an applied voltage of approximately 75 volts for a pulse duration of from 1 to 10 microseconds. This thickness range, and preferred thickness, is thick enough to prevent accidental short circuiting between an electrical contact disposed on the section 22 and the region 14, yet is thin enough to "blow" when the low energy pulse is applied.

Figure 3:
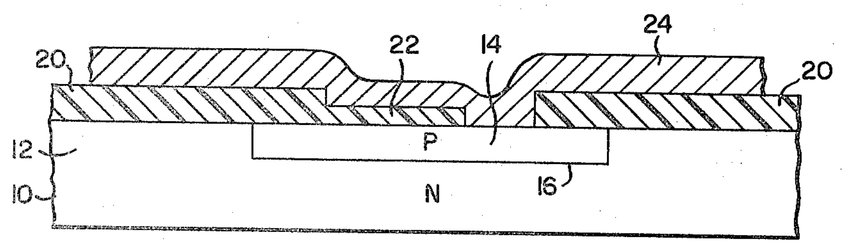

With reference to FIG. 3, a suitable electrical contact metal layer 24 is preferably vapor deposited on the layer 20, the reduced section 22, and the exposed surface area of the region 14. The electrical contact metal layer 24 is approximately 5,000 A. to 10,000 A. in thickness. The material comprising the layer 24 must be one which will form a good initial ohmic contact with the region 14 in the vicinity where it is deposited on the exposed surface of the region 14. Additionally the material comprising the layer 24 must be capable of contacting the region 14 with a low resistance conductance path when the layer of silicon oxide comprising the reduced section 22 is broken down by application of a low energy pulse. Suitable materials for comprising the electrical contact layer 24 are aluminum, chromium and gold, molybdenum and gold, titanium and silver, and titanium and gold, the latter pairs of materials being deposited as successive layers. The layer 24 may be formed by any suitable means such, for example, as by vacuum evaporation techniques.

Figure 4:
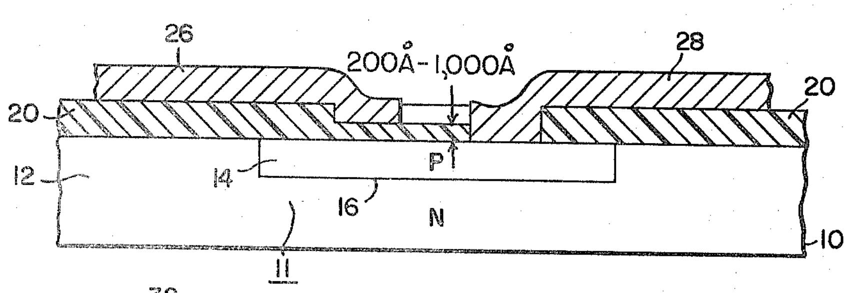

Referring now to FIG. 4, photolithographic techniques followed by selective chemical etching are employed to open a window in the electrical contact layer 24 thereby forming two distinct electrical contacts 26 and 28. The window electrically separates the contacts 26 and 28 from each other under normal operating conditions to be experienced by the array 10. The contact 26 is disposed on the silicon oxide layer 20 and a portion of the reduced section 22. The contact 28 forms the ohmic electrical contact to the region 14.

Figure 5:
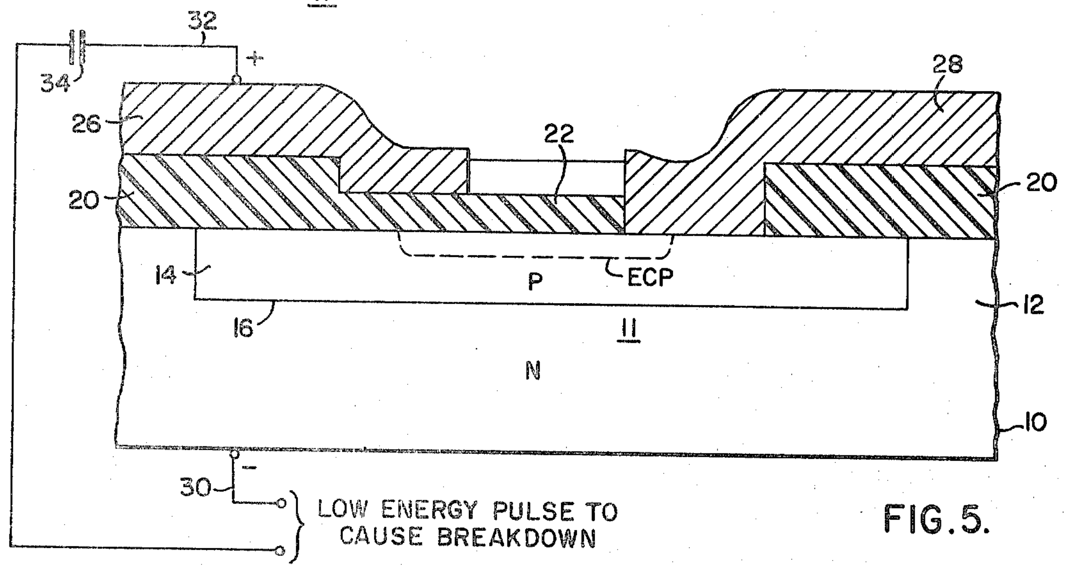
FIG. 5 is a view depicting an electrical arrangement for forming an electrically conductive path between the two electrical contacts of the body of semiconductor material of FIG. 4.

With reference to FIG. 5 there is shown one typical means of effecting a permanent repair physical device. A semiconductor element or circuit (not shown) may be found defective by external detection circuitry. The electrical function of the defective circuit is to be removed by diverting the electrical output current through device 11. Another permanent repair physical device may be used to make an electrical connection to an operable semiconductor or circuit that replaces the defective circuit that was removed.

An electrical lead 30 is affixed to the bottom surface of the array 10 in the vicinity of the device 11. Another electrical lead 32 is affixed to that portion of the contact 26 which is above the thick layer 20 of silicon oxide. The lead 32 is in turn connected to a coupling capacitor 34 included in the required circuitry to permit the low energy pulse to apply voltage potential across insulator section 22 and to permit direct current isolation of contact 26 from the source of the low energy pulse.

For illustrative purposes only, the material comprising the contacts 26 and 28 is aluminum, the thickness of the reduced section 22 is 500 A., and the thickness of the layer 20 is 5,000 A. It is known that generally silicon oxide 100 A. in thickness will break down under an applied voltage of 10 volts. This is equivalent to an electric field of $10^9$ volts per meter. Therefore, to break down the silicon oxide of the section 22, a minimum of 50 volts per meter is required. To assure a breakdown of the silicon oxide of the reduced section 22, it has been found that a voltage of from 50 to 75 volts can be applied without damaging the array 10 since the electric field in the layer 20 is only $10^8$ volts per meter. A voltage pulse of from 50 to 75 volts of narrow width produces the desired electric field of $10^9$ volts per meter and low energy in layer 22 thus obtaining the permanent repair of the device 11 desired.

The voltage pulse of 75 volts draws very little power. This is important since if too much power is applied, or if the pulse is of too long a duration, the thermal energy dissipated in the layer 22 may be sufficient to cause fracturing of the reduced section 22, the layer 20 or both of them. Upon fracturing of the reduced section 22 of silicon oxide, complete destruction of the array 10 may occur unless the energy dissipated is controlled because the fracture of the layers 20 and 22 and the interaction of the metal aluminum with the silicon oxide and/or the silicon of the region 14 may degrade the p-n junction 16 characteristics. When the thermal energy becomes too great, the thick oxide layer 20 may fracture and aluminum diffuses into the n-region of silicon and forms undesirable p-regions in the array 10.

Figure 6:
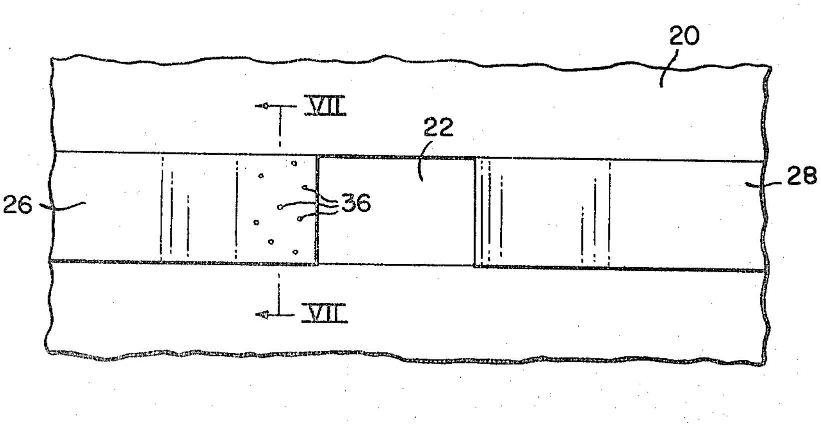
FIG. 6 is a planar view of a portion of the body shown in FIG. 5 after an electrical pulse has been applied in accordance with the teachings of this invention.
Figures 7, 8:
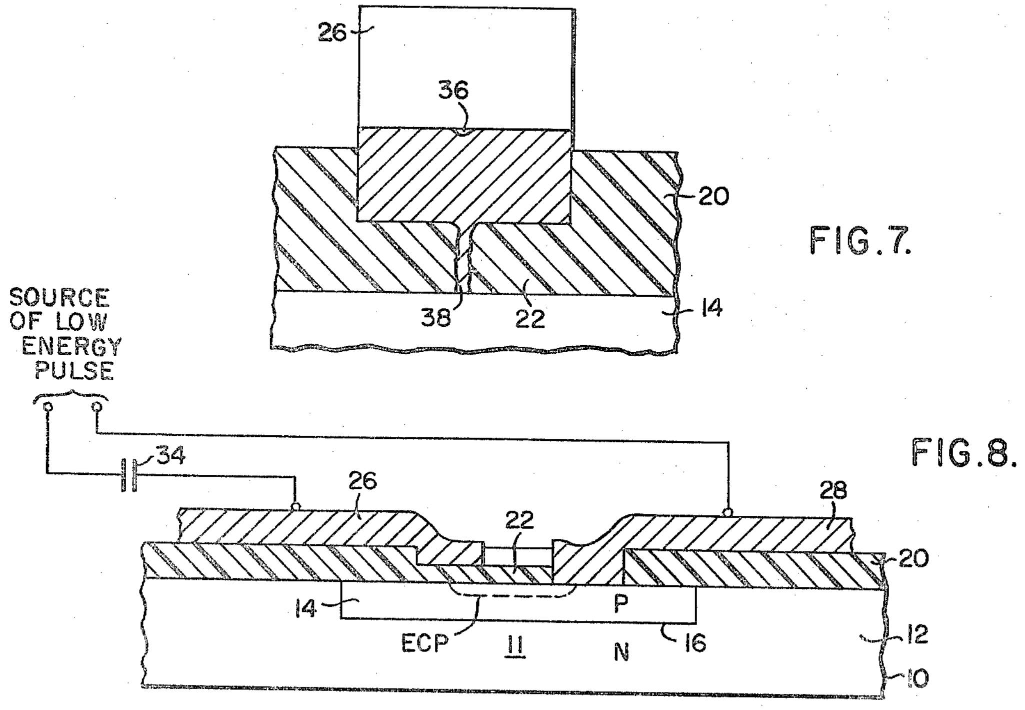
FIG. 7 is an enlarged cross-sectional view of the body of FIG. 6 taken along the cutting plane VII—VII.
FIG. 8 is another electrical arrangement for forming an electrically conductive path between the two electrical contacts of the body of semiconductor material of FIG. 4.

When the proper 75 volt pulse is applied, a good ohmic contact is achieved between the contact 26 and the region 14 by means of at least one low resistance path extending between the contact 26 and the region 14 through the reduced section 22 of silicon oxide. Examination of sections of the device 11 have revealed structures as shown in FIGS. 6 and 7. The low resistance path, or paths, appears to be a fused metal-insulator material mixture.

With reference to FIG. 6, the surface of the contact 26 immediately above the reduced section 22 of silicon oxide has a pock-marked effect wherein indentions 36 have been formed in the surface. There is no set distribution pattern. A cross-section of the device 11 taken through one of the indentions 36 showed a structure as shown in FIG. 7. A pipelike structure 38 was formed beneath the indention 36 and extended from at least the top surface of the region 14 upwardly through the reduced section 22 of silicon oxide to the contact 26. It appeared that localized heating had occurred, melting the aluminum and it may have caused some alloying of some nature with the silicon oxide material. What the material composition is of the pipelike structure 38 is not known. However it is known that the material has low electrical resistance and enables one to achieve an electrical short circuit between contacts 26 and 28 along the electrically conductive path ECP (see FIG. 5) in region 14. It is known that aluminum reacts with silicon oxide above 500° C. and it is speculated that there may be enough localized heating occurring which may form the low resistance conductive path of the pipe-like structure 38.

Upon breaking down the silicon oxide of the reduced section 22, the device 11 will pass current through the region 14 between the contacts 26 and 28 is the same as if the contacts 26 and 28 was joined together physically or connected together electrically by a piece of electrically conducting wire.

It is to be noted that the polarity of the means for causing the silicon oxide breakdown is important. It is preffered that a positive going pulse be employed since the full voltage applied to the circuit will occur across the reduced section 22. If the polarity of the applied voltage is reversed, then a voltage division will occur. A voltage division occurs between the gate capacitance and the junction capacitance and full voltage across the reduced section 22 is not obtained. Therefore, a higher voltage is required and consequently the possibility of damage to the array 10 is increased.

Referring now to FIG. 8, there is shown an alternate method of breaking down the reduced portion 22 of silicon oxide. In this alternate method the low energy pulse is applied between two electrical leads, one of which is electrically connected to the electrical contact 26 and the other of which is electrically connected to the electrical contact 28. An electrical pulse of aproximately 75 volts and of a duration of less than 10 microseconds has been found to be sufficient to break down the reduced portion 22 of silicon oxide of 500 A. thickness and where the region 14 has a dopant surface concentration of greater than $10^{18}$ atoms per cubic centimeter. The polarity of the applied low energy pulse is of no particular significance as no voltage division will occur as described heretofore for FIG. 5. The electrically conductive path, ECP, after breakdown of the reduced portion 22 of silicon oxide is shown in the region 14 in FIG. 8.

Figure 9:
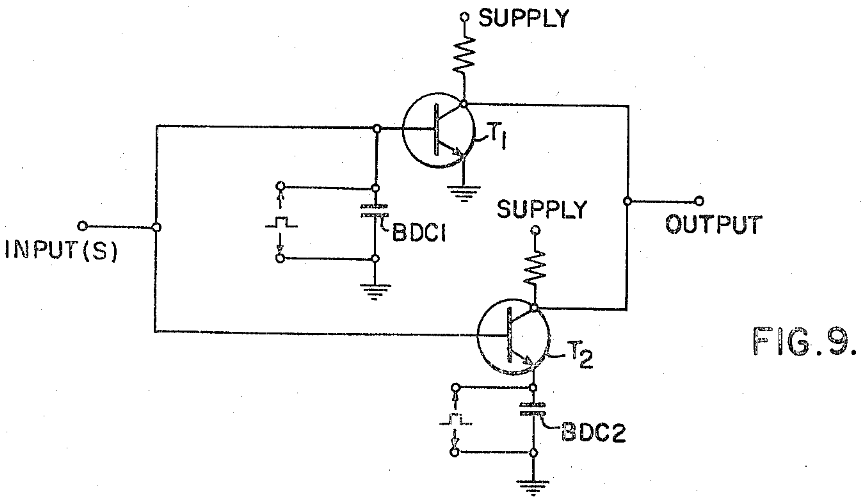
FIG. 9 is a schematic of an electrical system embodying the teachings of this invention.

FIG. 9 shows one type of application of the invention. In a digital logic system comprising a number of logic gates, redundancy may be employed to make sure failure of an individual gate does not disable the entire system. Illustrated is transistor $T_1$, that is the invention element of a logic gate having one or more inputs (normally through impedance elements, not shown) connected to the base of $T_1$ to provide NAND/NOR functions. Transistor $T_2$, in a gate identical to that including $T_1$, is a standby element only to be used in the event of failure of the $T_1$ gate.

Two breakdown capacitors in accordance with this invention are provided. Breakdown capacitor BDC1 is connected to the base of $T_1$. If "closed" by a voltage pulse applied across BDC1, the base of $T_1$, is connected to ground, the potential of the emitter, and $T_1$ is permanently disabled. Breakdown capacitor BDC2 is connected to the emitter of $T_2$, and when "closed," the emitter is connected to ground for operation of $T_2$.

We claim as our invention:

1. A semiconductor member suitable for use in an integrated circuit comprising a body of semiconductor material having a top surface and a bottom surface comprising (a) an array of semiconductor devices formed on said body as a common substrate;

(b) at least one of said semiconductor devices having a breakdown capacitor operatively associated therewith, said breakdown capacitor having at least first and second abutting regions of opposite type semiconductivity material and a p-n junction formed at the abutting surfaces of said regions;

(c) said first and second abutting regions of at least one of said array of semiconductor devices having a second surface comprising the top surface of said body of semiconductor material and said p-n junction formed by the abutting surfaces having an end portion exposed in said top surface of said body consisting of said second surfaces of said first and second regions;

(d) a layer of electrically insulating material having two integral portions of different thickness disposed on at least a portion of the top surface of said body consisting of said surfaces of said first and second regions and comprising a first portion of greater thickness than a second portion, said first portion being disposed on at least a selected portion of said second surface of said first and second regions and said exposed end portion of said p-n junction and said second portion being disposed only on a first selected portion of the second surface of said second region;

(e) a first electrical contact disposed on at least the second portion of the layer of electrically insulating material;

(f) a second electrical contact disposed on, and electrically connected to, a second selected portion of the second surface of the second region; and (g) said first electrical contact and the thickness of the second portion of the layer of electrically insulating material being so constructed and arranged whereby a pulse of electrical energy of a magnitude sufficient to break down said second portion of the layer of electrical insulating material underlying said first electrical contact creates a permanent electrically conductive path between said first electrical contact and said second electrical contact through said second portion of said layer and said second layer.

2. The semiconductor member of claim 1 wherein means are provided for connecting either of the second or first electrical contacts to a source of electrical potential and the such electrical contact is in circuit with the said at least one semiconductor device, whereby current from the source of electrical potential will normally flow either to the semiconductor device or be insulated therefrom but upon the pulse of energy causing the breakdown and formation of an electrically conductive path, the semiconductor device is either connected into the circuit with the source of electrical potential or disconnected therefrom by reason of such electrically conductive path.

3. The semiconductor structure of claim 2 in which said layer of electrically insulating material consists of a material selected from the group consisting of silicon oxide and silicon nitride.

4. The semiconductor structure of claim 3 in which said second portion of said layer of electrically insulating material has a thickness of from 200 A. to 1000 A. and the remaining portion is from about 5000 A. to 20,000 A.

5. The semiconductor structure of claim 4 in which said means comprises a first electrical lead electrically connected to said first electrical contact, a coupling capacitor series electrically connected to said first electrical lead, a second electrical lead electrically connected to said first region, and a source of a low energy pulse electrically connected across said coupling capacitor and said second electrical lead.

6. The semiconductor structure of claim 5 in which the capacitance of said second portion of said layer of electrically insulating material is less than one-tenth the capacitance of said coupling capacitor.

7. The semiconductor structure of claim 6 in which the thickness of said second portion of said layer of electrical insulating material is 500 A.

8. The semiconductor structure of claim 7 in which said layer of electrical insulating material is silicon oxide.

References Cited

UNITED STATES PATENTS

| | | | |
|---|---|---|---|
| 3,056,073 | 9/1962 | Mead | 317—234 |
| 3,447,043 | 4/1969 | Wallace | 317—234 |

JERRY D. CRAIG, Primary Examiner

U.S. Cl. X.R.

29—575; 307—213, 303